United States Patent [19]
Ditlow et al.

[11] Patent Number: 5,712,790
[45] Date of Patent: Jan. 27, 1998

[54] METHOD OF POWER REDUCTION IN PLA'S

[75] Inventors: Gary Stephen Ditlow, Garrison, N.Y.; Paul David Kartschoke, Williston, Vt.

[73] Assignee: International Business Machines Corporation, Armonk, N.Y.

[21] Appl. No.: 419,772

[22] Filed: Apr. 11, 1995

[51] Int. Cl.$^6$ .......................... H03K 19/177; G06F 17/50
[52] U.S. Cl. ..................... 364/489; 364/488; 326/39
[58] Field of Search ....................... 364/490, 489, 364/488; 326/39, 41

[56] References Cited

U.S. PATENT DOCUMENTS

| | | | |
|---|---|---|---|
| 4,761,768 | 8/1988 | Turner et al. | 365/201 |
| 4,814,646 | 3/1989 | Hoberman et al. | 307/467 |
| 4,839,539 | 6/1989 | Takata et al. | 307/465 |
| 4,851,720 | 7/1989 | Pathak et al. | 307/530 |
| 4,864,165 | 9/1989 | Hoberman et al. | 307/467 |
| 5,121,005 | 6/1992 | Parker | 307/465 |
| 5,202,592 | 4/1993 | Yonoda et al. | 307/465 |
| 5,300,831 | 4/1994 | Pham et al. | 307/465 |
| 5,311,079 | 5/1994 | Ditlow et al. | 307/465 |
| 5,473,548 | 12/1995 | Omori et al. | 364/489 |
| 5,515,302 | 5/1996 | Horr et al. | 364/488 |
| 5,576,636 | 11/1996 | Baucom | 326/39 |

FOREIGN PATENT DOCUMENTS

| | | | |
|---|---|---|---|
| 0256336A3 | 7/1987 | European Pat. Off. | H03K 19/177 |
| 0325180A2 | 1/1989 | European Pat. Off. | H03K 19/177 |
| 0465002A2 | 5/1991 | European Pat. Off. | H03K 19/177 |

OTHER PUBLICATIONS

"Power Reduction Method for Static CMOS Programmable Logic Arrays (PLAS)"; IBM Technical Disclosure Bulletin, vol. 30, No. 10, Mar. 1988, pp. 247–248.

"Electrical Optimization of PLAs" by K. Hedlund, IEEE 22nd Design Automation Conference, 1985, pp. 681–687.

"Computation of Power Supply Nets in VLSI Layout" by H. Rothermel et al, IEEE 18th Design Automation Conference, 1981, pp. 37–42.

"Optimization of Digital MOS VLSI Circuits" by M. Matson, IEEE Chapel Hill Conference, 1985, pp. 109–126.

IBM Technical Disclosure Bulletin, "Minimizing Power in High Performance PLA's", vol. 32, No. 6B, Nov. 1989, pp. 362–367.

*Primary Examiner*—Vincent N. Trans
*Attorney, Agent, or Firm*—Susan M. Murray; Whitham, Curtis, Whitham & McGinn

[57] ABSTRACT

A reduced power programmable logic array is disclosed. The circuit includes an AND array, coupled through product term lines to an output OR array. Pull-up devices in the OR array are gated to one of the active product term lines. Also disclosed is method for choosing a product term line for gating pull-up devices such that power consumption in the pull-up devices is minimized.

10 Claims, 3 Drawing Sheets

METHOD OF POWER REDUCTION IN PLA'S

CROSS-REFERENCE TO RELATED APPLICATION

This application is related to U.S. Ser. No. 08/419,771, entitled "Reduced Power PLA" filed concurrently herewith, which is incorporated by reference herein.

FIELD OF THE INVENTION

This invention relates to programmable logic arrays and more particularly to a circuit and method for reducing power consumption in programmable logic arrays.

BACKGROUND OF THE INVENTION

Programmable logic arrays (PLA's) are used by circuit designers to accelerate the design cycle by beginning the design above the device level. PLA's normally comprise a plurality of AND gates programmably connected to a second plurality of OR gates. PLA's can be used to generate any combinational function because any combinational logic function can be described as a sum of products, the products being generated in the AND array and the sums being generated in the OR array. The programmable elements of PLA's may be constructed of a variety of devices, but are most commonly constructed of transistors connected to a fusible link.

A particular type of PLA which is widely used is the ratio logic PLA, also called the pseudo N-MOS PLA, an example of which is shown in FIG. 1. Referring the FIG. 1, at a plurality of output nodes in OR array 30, at least one N-MOS load transistor 14 is connected to a P-MOS pullup device 15 biased such that it is always conducting. The voltage level of the output node 16 is dependent upon the relative resistances of the pull-up device 15 and load transistors 14 at the same output node, which is primarily controlled by the size of the devices, hence the name ratio logic. Normally, the N-MOS load transistors 14 in the OR array are sized larger than pull-up devices 15, such that the pull-up 15 devices are only capable of pulling the output high when all of the N-MOS load transistors 14 connected to the same output line are inactive.

Ratio logic PLA's have several advantages which make their use desirable. They are relatively simple to program, and provide for fast design. Layout is also simplified since both the AND array and OR array are constructed of transistors of a single conductivity type. The only transistors required of an opposite conductivity are the pull-up transistors 15. The combination of design and layout convenience make ratio logic PLA's a cost-effective method of implementing circuit designs.

Ratio logic PLA's also have several disadvantages which prevent them from being more widely used. Because current is constantly being drawn, ratio logic PLA's tend to have high DC power consumption. High power consumption is particularly a problem for portable computer systems which are battery operated. The high current drain also creates reliability problems due to hot electron effects and electromigration.

Several approaches have been proposed to reduce power consumption in PLA's. U.S. Pat. No. 5,300,831 to Pham et al, of common assignee, entitled "Logic Macro and Protocol for Reduced Power Consumption During Idle State", discloses a logic macro for a processor including a static PLA and further including a control circuit for shutting off any active current path in and driving the array outputs to zero whenever an idle state condition exists. When the logic macro receives an idle signal, indicating the processor is idle or halted and that power conserving procedures are to be initiated, the macro internal clock is halted and the static PLA is subsequently decoupled, at least partially, from the supply voltage. When the idle state is terminated the PLA is recoupled to the supply voltage and its outputs are allowed to stabilize prior to restarting the macro's internal clock. This approach is disadvantageous because the control circuit adds complexity to the design and requires additional area. Furthermore, the responsiveness of the PLA is hampered by the need to stabilize outputs prior to restarting. Lastly, this approach does not address the need to reduce power consumption when the processor is active.

U.S. Pat. No. 5,311,079 to Pham et al, also of common assignee, entitled "Low Power High Performance PLA", teaches a power reduction method for PLA's which is effected when the processor is active. A front-end decoder is added to the PLA to selectively activate pull-up devices associated with the product terms, such that the pull-up devices do not consume power unless they are involved in the logical function implemented by the array. However, the decoder adds complexity to the design and requires significant additional circuit area.

What is needed is a means for reducing power consumption in PLA's without reducing the performance or significantly increasing the size of the PLA.

OBJECTS OF THE INVENTION

It is an object of the present invention to reduce power consumption in PLA devices.

It is a further object of the present invention to increase reliability of PLA devices.

It is a further object of the present invention to reduce power consumption in PLA's by selectively activating a plurality of pull-up devices.

It is a further object of the present invention to provide a method of selectively activating a plurality of output pull-up devices.

BRIEF DESCRIPTION OF DRAWINGS

The foregoing and other objects, aspects and advantages will be better understood from the following detailed description with references to the drawings, in which.

SUMMARY OF THE INVENTION

The invention involves a method for selectively activating particular devices in a programmable logic array so as to reduce power consumption in a PLA. The PLA has a product term array (AND array) for combining inputs into product terms and a product term selection array (OR array) for combining product terms into outputs. Pull-up (down) devices are connected to the outputs of the OR array for pulling the voltage high (low) if no pull-down (pull-up) devices in the OR array for a given output are activated. The pull-up (down) devices are selectively activated.

The present invention is a method for selectively activating the pull-up (down) devices by selecting one or more product terms to gate one or more pull-up (down) devices. First, the product terms which have at least one connection to an input in the OR array are identified. Logical attributes contributing to array power dissipation are determined for each identified product term. A power saving potential function is then determined for each identified product term or for combinations thereof. The product term or combination of product terms which maximizes the power saving potential function is then used to gate the pull-up (down) device so as to reduce power consumption in the PLA.

DETAILED DESCRIPTION OF PREFERRED EMBODIMENT

Figure 1:
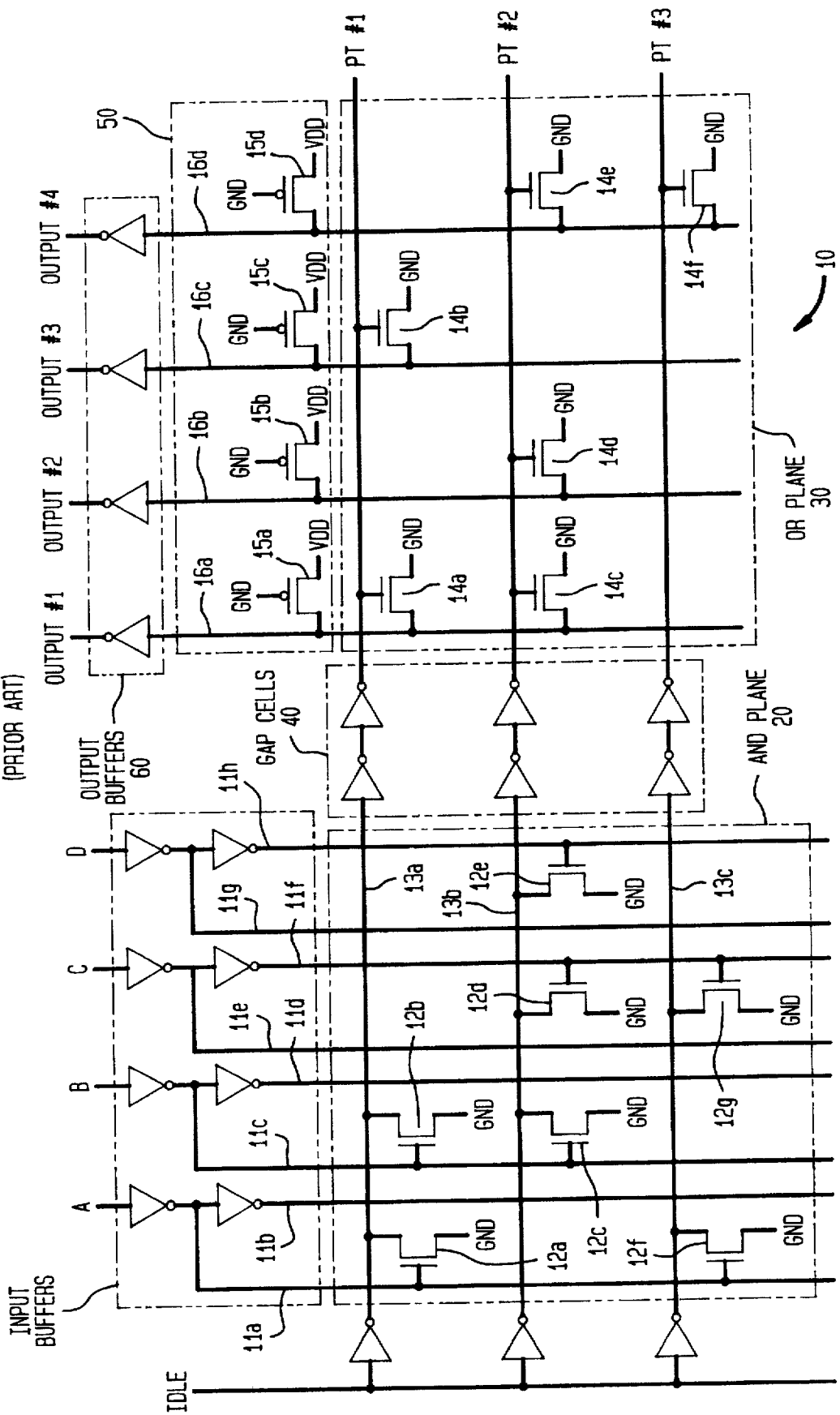
FIG. 1 is a circuit schematic of a prior art PLA.

Referring the FIG. 1, a representative prior art PLA includes a plurality of inputs 11 which may be buffered, AND array 20, intermediate buffer stage 40, OR array 30, OR array pull-up stage 50 and, optionally, output buffer stage 60. AND array 20 is coupled to inputs 11 by means of programmably connected transistors 12 and outputs product terms 13. Product terms 13 are buffered by intermediate buffer stage 40. OR array 30 is coupled to receive the buffered product terms and to selectively combine them by means of programmably connected N-MOS load transistors 14, providing outputs 16. In pull-up stage 50 pull-up devices 15 operate to pull their respective outputs high when all of the load transistors 14 connected to the same output are inactive (i.e. product terms are low). The logical functions produced by the PLA shown in FIG. 1 are as follows:

OUT1=A'B'+B'CD;

OUT2=B'CD;

OUT3=A'B'; and

OUT4=B'CD+A'C where "'" indicates an inversion of a term and "+" indicates a logical "OR".

With continued reference to FIG. 1, attention is called to the manner of configuring pull-up devices 15. Each have their gate connected to ground, their source connected to power supply voltage Vdd, and their drain connected to an output 16 such that they are always active, even when they are not needed to realize the logical function implemented in the PLA. Associated with this static configuration is unnecessarily high DC power consumption.

Low Power PLA

Figure 2:
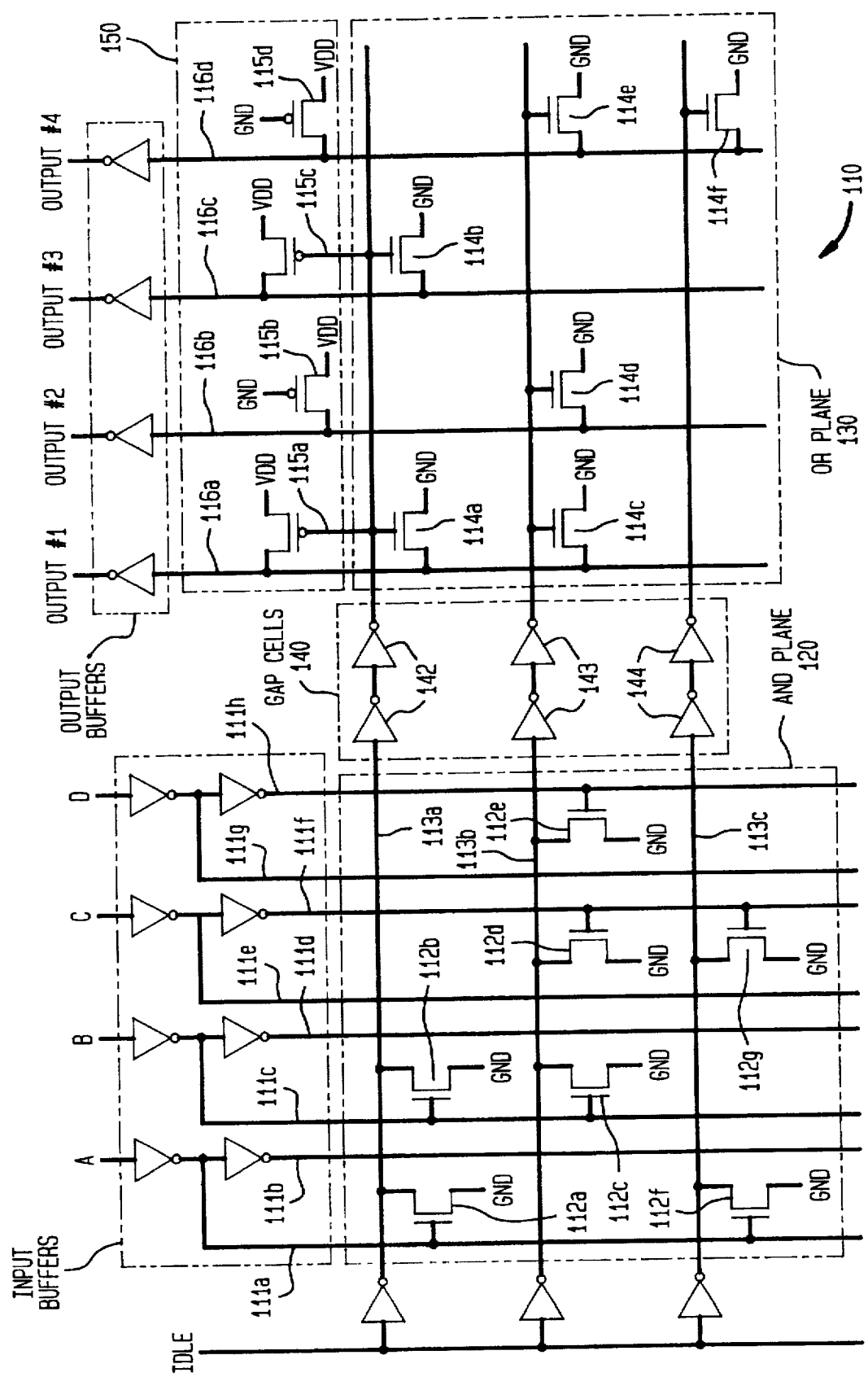
FIG. 2 is a circuit schematic of a preferred embodiment of the low power consumption PLA.

Referring to FIG. 2 there is shown a preferred embodiment circuit schematic for a reduced power PLA. Low power PLA 110 includes elements similar to the prior art array 10 and operates similarly to produce the same logical functions. Similar or corresponding elements are numbered similarly to those in FIG. 1. The important distinction between low power PLA 110 and prior art PLA 10 is in pull-up stage 150. At least one of the pull-up devices 115 of pull-up stage 50 is selectively activated, preferably by gating it with one of the product term lines 113, rather than tying it to ground as is conventional. For example, FIG. 2 shows pull-up devices 115a and 115c gated by a product term line, while pull-up devices 115b and 115d remain statically gated on. For convenience of illustration, the product term line 113a shown gating pull-up devices 115a and 115c is the one nearest the pull-up stage, but any product term line may be used.

By gating pull-up devices 115 by one or more product term lines 113 the power dissipation in the PLA 110 is reduced. More particularly, the pull-up devices 115 will only be activated when the product term gating them is low, resulting in lower power dissipation than the traditional static design. The logical function of the PLA is unaffected by the change in configuration of pull-up devices 115. If a product term 113 is high, an OR output 116 connected to that product term 113 will be brought low by means of the associated load device 114. In such a case, it is unnecessary to activate the pull-up device 115. If the product term 113 is low the pull-up device 115 is activated in the event there are other load devices 114, associated with other product terms 113, which will need to compete with the pull-up device 115 to determine the output level.

In order to maintain performance of the product term selected for gating the pull-up devices as compared to other product terms, it is preferable to increase slightly the size of the devices in intermediate buffering stage 140 which are associated with that product term. For example, in FIG. 2 buffers 142 in intermediate buffering stage 140 are somewhat larger than buffers 143 and 144, since product term 113a is used to gate pull-up devices 115a and 115c. Minimal area is required for this minor adjustment.

The low-power circuit above described is most advantageously used when the product term used to gate pull-up devices is selected in such a way as to minimize power consumption.

For purposes of convenience and clarity the ratio logic circuits described herein have been characterized as pseudo-NMOS, having NMOS type load devices in the AND and OR arrays with PMOS types of pull-up devices at the output node. In light of the above disclosure a person skilled in the art would observe that with minor adjustments the ratio logic array can also be implemented as a pseudo-PMOS array having PMOS device in the AND and OR arrays and NMOS pull-down devices at the output node.

Method of Selecting Product Term

A method of selecting a product term or a combination of product terms used to gate pull-up devices so as to minimize power consumption will now be described. The general principle governing the method is to choose the product term or the combination of product terms to which could be attributed the largest amount of unnecessary pull-up device power consumption (i.e. drawing current through the pull-up device when the selected product term would have caused the output to be pulled low by the associated load device).

Figure 3:
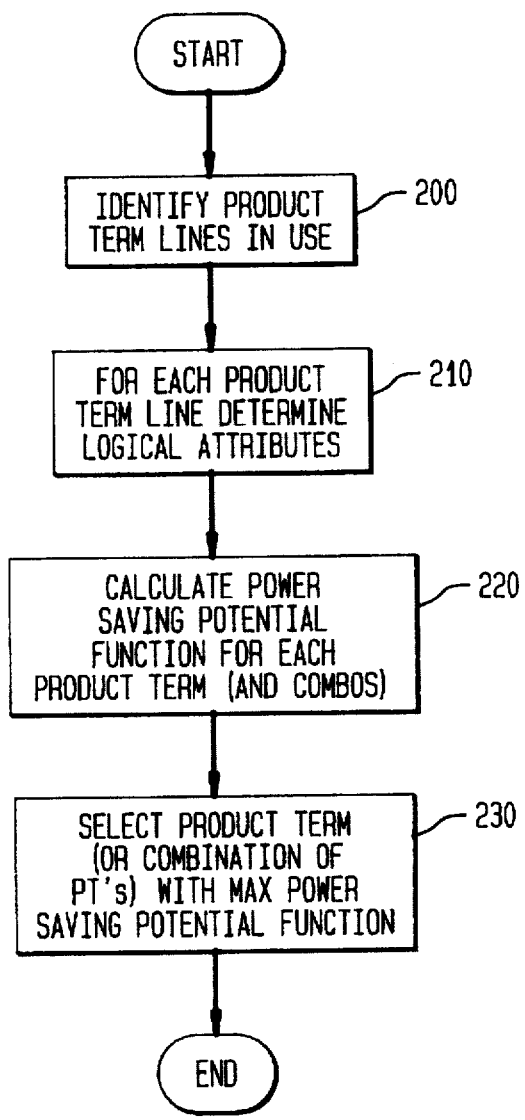
FIG. 3 is a flow diagram describing the steps of a method of selecting a product term line for selectively activating a plurality of product term pull-up devices in the low power consumption PLA.

The method is shown in FIG. 3, in conjunction with the schematic in FIG. 2. In step 200, the product terms lines 113 that are in use are identified. Product term lines not in use are excluded because unnecessary pull-up power consumption is not attributable to them.

In step 210, the logical attributes which would suggest the amount of unnecessary pull-up power consumption attributable to each power term are determined for each product term in use. The logical attributes used are preferably: 1) the probability that the product term 113 will not be activated (number of "don't cares" in the AND array 120); and 2) the percentage of output lines 116 in the OR array 130 controlled by the product term.

In step 220, the power saving potential function for each product term line in use and for combinations thereof is calculated. If the preferred logical attributes are employed, the power saving potential function is preferably the product of the probability that the product term will not be activated and the percentage of output lines in the OR array controlled by the product term, but other similar functions may also be used. In some cases combinations of product terms will produce higher power savings potential, particularly where they have non-overlapping outputs as will be described in further detail below.

In step 230, the product term or combination of product terms having the highest power saving potential function is selected.

The method of choosing a product term will now be illustrated by example. Table 1, below, represents in shorthand notation the low-power PLA of FIG.2. A, B, C and D represent pairs of complementary inputs connected to the AND array 120. Product terms 113 are designated as "PTn", each having its own row. For each product term, the inputs are defined as 1, indicating a connection with a given input, a 0, indicating a connection with a complementary input or a blank, indicating no connection between the input and product term ("don't care" condition). OUT1, OUT2, OUT3, OUT 4 represent outputs of the array resulting from the OR'ing of product terms PT1–PT3. A "1" below the OUTn columns indicates a programmable connection between that output and the product term. PNA indicates for each product term the probability that the product term will be not activated. OC indicates the percentage of output lines coupled to the given product term. PSP indicates the power saving potential for the product term.

In the case of product terms 1 and 3, PT1 and PT3 respectively, because 2 complementary inputs are not connected in the AND array, the probability that the product term will not be activated is $4/16=1/4$ as indicated in the PNA column. In the case of product term 2, PT2, because 1 complementary input is not connected in the AND array, the probability that the product term will not be activated is $2/16=1/8$ as indicated in the PNA column. The percentage of output lines controlled for PT1, PT2 and PT3 is respectively $1/2$, $3/4$ and $1/4$. The power savings potential, which is the product of PNA and OC, for PT1, PT2 and PT3 is respectively $1/8$, $3/32$, $1/16$. In this example, the power saving potential is highest for product term 1, so product term 1 would be used to gate the pull-up devices.

TABLE 1

|     | A | B | C | D | OUT1 | OUT2 | OUT3 | OUT4 | PNA | OC  | PSP  |
|-----|---|---|---|---|------|------|------|------|-----|-----|------|
| PT1 | 0 | 0 |   |   | 1    | 0    | 1    | 0    | 1/4 | 1/2 | 1/8  |
| PT2 |   | 0 | 1 | 1 | 1    | 1    | 0    | 1    | 1/8 | 3/4 | 3/32 |
| PT3 | 1 | 1 |   |   | 0    | 0    | 0    | 1    | 1/4 | 1/4 | 1/16 |

As mentioned above, product terms can also be combined to maximize the amount of power conserved, as will now be shown by way of example. Shown in Table 2 are the logical attributes associated with combinations of product terms. The combined PNA (CPNA) for product terms 1 and 2 (PT12) is the sum of the PNA for product term 1 and the PNA for product term 2 ($1/4+1/8=3/8$). The combined OC (COC) for PT12 reflects the percentage of outputs controlled by PT1 or PT2. More particularly 100% of the output lines are controlled by the combination of PT1 and PT2 since PT1 controls outputs 1, 3 and 4 while PT2 controls 1, 2 and 4. The combined power saving potential (CPSP) is the product of CPNA and COC, which is $3/8$ for PT12. The arithmetic for PT23 and PT13 follows the same pattern. In this case the combination of product terms 1 and 2 or the combination of product terms 1 and 3 would be equally effective. It should also be observed that, for this example, the power savings potential is higher for a combination of product terms than for a single product term.

TABLE 2

|      | OUT1 | OUT2 | OUT3 | OUT4 | CPNA | COC | CPSP |
|------|------|------|------|------|------|-----|------|
| PT12 | 1    | 1    | 1    | 1    | 3/8  | 1   | 3/8  |
| PT23 | 1    | 1    | 0    | 1    | 3/8  | 3/4 | 9/32 |
| PT13 | 1    | 0    | 1    | 1    | 1/2  | 3/4 | 3/8  |

Other arrangements and variations in the circuit and method disclosed herein maybe used without departing from the spirit and scope of the invention as set forth herein in the following appended claims.

What is claimed is:

1. A method for selectively activating at least one device of a second conductivity in a programmable logic array comprising a product term array for selectively combining at least two inputs and providing at least one product term signal, a product term selection array for connecting selected ones of the at least one product term signal to selected ones of the at least one output line by way of at least one device of a first conductivity type, and a device of the second conductivity type coupled to each of the at least one output lines for setting the voltage of the at least one output lines if none of the devices of the first conductivity type connected to the output line is activated, wherein at least one of the devices of the second conductivity type are selectively activated, the method comprising the steps:

identifying product terms which have at least one connection to an input in the product term array;

determining logical attributes contributing to array power dissipation for each identified product term;

determining a power saving potential function for each product term line having at least one connection in the product term array array; and gating at least one device of the second conductivity type by a product term that maximizes the power saving potential function.

2. The method of claim 1 wherein the logical attributes include the probability that a product term will not be activated in the product term array.

3. The method of claim 1 wherein the logical attributes include the percentage of output lines controlled by that product term.

4. The method of claim 1 wherein the logical attributes include the probability that a product term will not be activated in the product term array and the percentage of output lines controlled by that product term.

5. The method of claim 4 wherein the step of determining the power saving potential function comprises multiplying the probability that a product term will not be activated in the product term array by the percentage of output lines controlled by that product term.

6. A method for selectively activating at least one device of a second conductivity in a programmable logic array comprising a product term array for selectively combining at least two inputs and providing at least one product term signal, a product term selection array for connecting selected ones of the at least one product term signal to selected ones of the at least one output line by way of at least one device of a first conductivity type, and a device of the second conductivity type coupled to each of the at least one output lines for setting the voltage of the at least one output lines if none of the devices of the first conductivity type connected to the output line is activated, wherein at least one of the devices of the second conductivity type are selectively activated, the method comprising the steps:

identifying product terms which have at least one connection to an input in the product term array;

determining logical attributes contributing to array power dissipation for each identified product term;

combining identified product terms based on their logical attributes contributing to array power dissipation;

determining a power saving potential function for each combination of product terms in the product term array; and gating at least one device of the second conductivity type by a combination of product terms that maximizes the power saving potential function.

7. The method of claim 6 wherein the logical attributes include the probability that a product term will not be activated in the product term array.

8. The method of claim 6 wherein the logical attributes include the percentage of output lines controlled by that product term.

9. The method of claim 6 wherein the logical attributes include the probability that a product term will not be activated in the product term array and the percentage of output lines controlled by that product term.

10. The method of claim 6 wherein the step of determining the power saving potential function comprises multiplying the probability that a product term combination will not be activated in the product term array by the percentage of output lines controlled by that product term combination.

* * * * *